United States Patent [19]
Kim

[11] Patent Number: 5,963,433
[45] Date of Patent: Oct. 5, 1999

[54] BOTTOM LEAD SEMICONDUCTOR PACKAGE WITH RECESSED LEADS AND FABRICATION METHOD THEREOF

[75] Inventor: Myeong-Ki Kim, Cheongju, Rep. of Korea

[73] Assignee: LG Semicon Co., Ltd., Cheongju, Rep. of Korea

[21] Appl. No.: 08/932,370

[22] Filed: Sep. 17, 1997

[30] Foreign Application Priority Data

Dec. 28, 1996 [KR] Rep. of Korea ....................... 96-75053

[51] Int. Cl.⁶ ......................... H01L 23/48; H01L 23/488; H01L 23/495; H01L 23/50
[52] U.S. Cl. ..................... 361/813; 174/52.4; 257/696; 257/730; 257/773
[58] Field of Search .................... 174/52.1, 52.2, 174/52.3, 52.4; 228/180.21, 180.22; 257/666, 676, 678, 690, 730, 692, 693, 779, 696, 773; 361/820, 760; 439/68, 70, 526; 438/124–127, 112

[56] References Cited

U.S. PATENT DOCUMENTS

| | | |
|---|---|---|
| 4,862,247 | 8/1989 | Derryberry et al. ..................... 257/730 |
| 5,200,362 | 4/1993 | Lin et al. ............................ 264/272.17 |
| 5,273,938 | 12/1993 | Lin et al. .................................. 438/108 |
| 5,428,248 | 6/1995 | Cha . |
| 5,744,827 | 4/1998 | Jeong et al. ............................. 257/692 |
| 5,760,471 | 6/1998 | Fujisawa et al. ........................ 257/723 |
| 5,770,888 | 6/1998 | Song et al. ............................... 257/692 |

FOREIGN PATENT DOCUMENTS

| | | | |
|---|---|---|---|
| 59-161851 | 9/1984 | Japan | ...................... 257/787 |
| 60-258938 | 12/1985 | Japan | ...................... 257/693 |
| 1-161724 | 6/1989 | Japan | ........................... 438/FOR 369 |
| 3-179722 | 8/1991 | Japan | ........................... 438/FOR 369 |
| 5-166964 | 7/1993 | Japan | ...................... 257/693 |
| 5-175354 | 7/1993 | Japan | ...................... 257/730 |

*Primary Examiner*—Donald Sparks
*Attorney, Agent, or Firm*—Fleshner & Kim

[57] ABSTRACT

A bottom lead semiconductor package includes a plurality of bottom leads with inner leads extended upwardly bent or inclined from corresponding ones of the bottom leads. A semiconductor chip is attached to an upper surface of each of the bottom leads by a nonconductive adhesive, and a plurality of conductive wires electrically connects a plurality of chip pads on the chip to the inner leads. A molding compound forms a package body having a plurality of openings such that a lower surface of each of the bottom leads is externally exposed. The fabrication method includes a molding step for sealingly molding the package but exposing the lower surface of the bottom leads and the inner leads upwardly bent extending from corresponding ones of the bottom leads. A mold with a plurality of protrusions on a bottom surface in the mold and the protrusions respectively serve to fill openings formed below each of the inner leads to prevent the flow of molding resin into the openings.

19 Claims, 2 Drawing Sheets

BOTTOM LEAD SEMICONDUCTOR PACKAGE WITH RECESSED LEADS AND FABRICATION METHOD THEREOF

BACKGROUND OF THE INVENTION

1. Field of the Invention

The present invention relates to a chip package, and more particularly, to an improved bottom lead semiconductor package (BLP) and a fabrication method thereof.

2. Background of the Related Art

Among generally known semiconductor chip packages, there are a small outline package (SOP) and a small outline J-lead (SOJ) in which the outer leads serving as electrical connection paths are exposed through sides of the package body. In such conventional semiconductor packages as described above, an area occupied by the package on a printed circuit board becomes increased mainly due to outer leads being protruded through sides of the package body during a mounting operation, thereby further generating quality problems during operation and transporting thereof.

FIG. 1 illustrates a schematic cross-sectional view of a conventional bottom lead semiconductor package mounted on a printed circuit board. Such a package is disclosed in U.S. Pat. No. 5,428,248 (issued Jun. 27, 1995) entitled "Bottom Lead Semiconductor Package (BLP)," which solves the above-described problems, and commonly assigned to the same assignee of the present invention. The package includes a lead frame 13 including a plurality of bottom leads 11. A bottom surface of each of the leads 11 are in contact with the printed circuit board 20. A plurality of inner leads 12 is respectively bent upwardly extending from a corresponding one of the bottom leads 11.

A semiconductor chip 15 is attached to an upper surface of each of the bottom leads 11 by adhesives 14, and a plurality of conductive wires 16 electrically connects chip pads (not shown) of the chip 15 to the inner leads 12 of the lead frame 13. A molding resin molds the wires 16, the semiconductor chip 15 and the respective leads 11, 12 of the lead frame 13 to form a package body 17. At this time, a portion of each of the bottom leads 11 is exposed through a bottom surface of the package body 17, and then the exposed lower surfaces of bottom leads 11 are plated with lead (not shown).

The bottom lead semiconductor package decreases a substrate-occupancy area and eliminates the outer leads which might become damaged. However, when the package is mounted on printed circuit board 20 by forming a solder 25 on a lower surface of each of the bottom leads 11, there is a solder joint (an electrical contact provided between a bottom lead and the printed circuit board by a solder) reliability problem because the lower surfaces of the bottom leads 11 and the bottom surface of the package body 17 are formed almost flush with each other due to the solder 25. Further, the package mounted on the printed circuit board can be unnecessarily raised by as much as the height of the solder 25.

The above references are incorporated by reference herein where appropriate for appropriate teachings of additional or alternative details, features and/or technical background.

SUMMARY OF THE INVENTION

An object of the present invention is to solve at least the problems of the related art.

Another object of the present invention to improve solder joint reliability.

A further object of the present invention is to minimize the mounted package height.

To achieve such objects, advantages and/or features, there is provided a bottom lead semiconductor package according to the present invention which includes a plurality of bottom leads, a plurality of inner leads extended upwardly and bendingly from a corresponding one of the bottom leads, a semiconductor chip attached to an upper surface of each of the bottom leads by a nonconductive adhesive, a plurality conductive wires for electrically connecting a plurality of chip pads on the chip to the inner leads, and a molding compound for sealing the semiconductor package but exposing externally a lower surface of each of the bottom leads.

Further, the fabrication method of the bottom lead semiconductor package includes a chip attaching step for attaching a semiconductor chip by a nonconductive adhesive on an upper surface of each of a plurality of bottom leads from which are upwardly and correspondingly extended a plurality of inner leads, wherein the bottom leads and the inner leads stem from a lead frame, a wire bonding step for electrically connecting, by a conductive wire, each of a plurality of bonding pads formed on the chip to a corresponding one of the inner leads, a tape attaching step for attaching a nonconductive tape on a lower surface of each of the bottom leads and the inner leads, a molding step for sealingly molding the package but exposing the lower surface of the bottom leads and the inner leads upwardly bent extending from corresponding ones of the bottom leads, and a removing step for removing the nonconductive tape from each of the bottom and inner leads.

The present invention can be also achieved in part or in whole by a package including a chip having a plurality of bond pads; a plurality of leads, each lead having first and second portions which have first and second surfaces; an adhesive that attaches the chip to the plurality of leads; a plurality of conductive media which couples corresponding bond pads to corresponding leads; a package body that molds the chip, the plurality of conductive media, the adhesive and the plurality of leads, wherein the second surface of the first portion is exposed from the package body, and the package body includes a plurality of openings such that the second surface of the second portion is exposed from the package body.

The present invention may be also achieved in part or in whole by a device including a printed circuit board having a plurality of pads; a chip package having a plurality of leads, the package having a plurality of openings to expose portions of the plurality of leads; a plurality of solder joints formed in the plurality of openings to attach the plurality of leads of the chip package to the plurality of pads of the printed circuit board.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
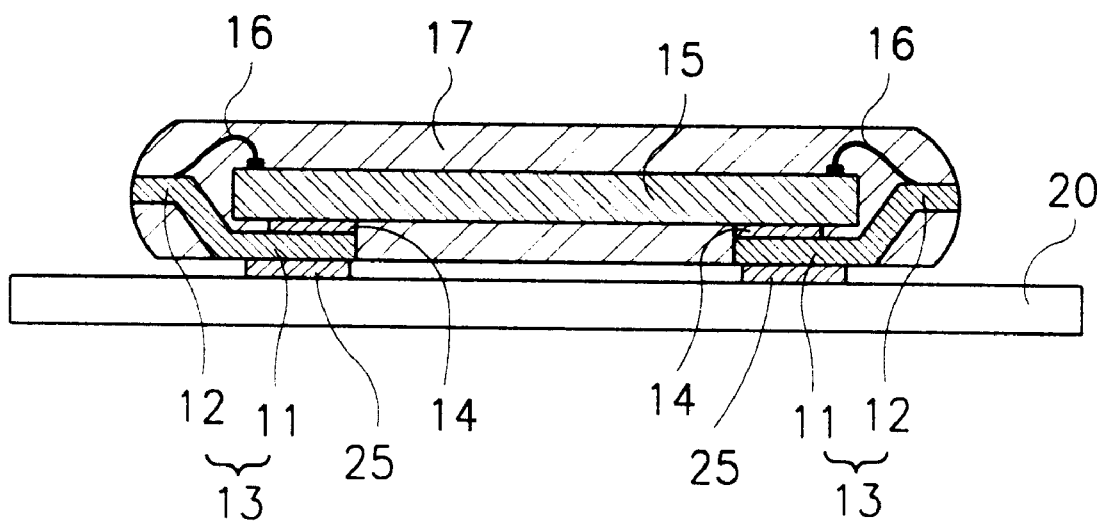
FIG. 1 is a schematic cross-sectional view of a conventional bottom lead semiconductor package mounted on a printed circuit board.
Figure 2:
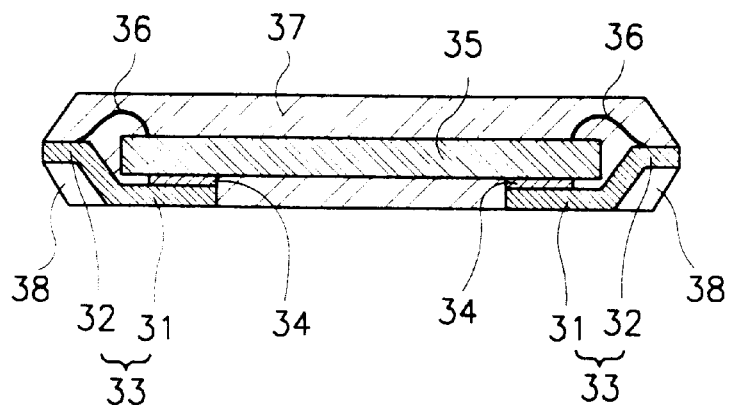
FIG. 2 is a schematic cross-sectional view of a bottom lead semiconductor package in accordance with the present invention.
Figure 3:
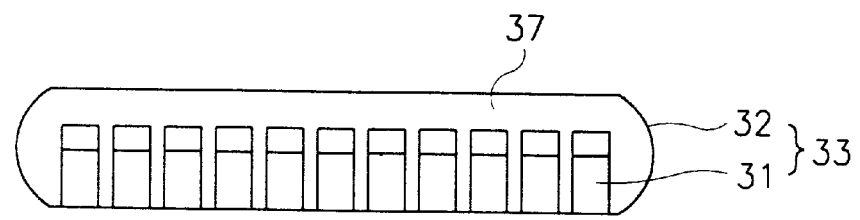
FIG. 3 is a side view of a bottom lead semiconductor package in accordance with the present invention.

FIGS. 2 and 3 respectively illustrate a cross-sectional view and a side view of the bottom lead semiconductor package according to the present invention. The package includes a plurality of bottom leads 31 and a plurality of inner leads 32 upwardly bent or inclined, extending from the respective bottom leads 31. On upper surfaces of the bottom leads 31, a semiconductor chip 35 is mounted by a nonconductive adhesive 34. The chip 35 and the inner leads 32 are electrically connected to each other preferably through conductive wires 36. As can be appreciated, solder bumps can be used. An epoxy resin molds the chip 35 to thereby form a package body 37. An opening 38 is formed in each side of the package body 37 so that a lower surface of each of the bottom leads 31 and the upwardly bent inner leads 32 extending from the bottom leads 31 are exposed externally from the package body 37.

To form the package, the lead frame 33 having the bottom leads 31 and the inner leads extended upwardly from the respective bottom leads 31 is initially prepared. The semiconductor chip 35 is attached to the upper surfaces of the bottom leads 31 of the lead frame 33 using the nonconductive adhesive 34 as a bonding medium. Conductive wires 36 are electrically connected from the chip 35 to the inner leads 32, and a nonconductive tape (not shown) is attached to the lower surface of each of the bottom leads 31 and the upwardly bent inner leads 32 extended from the bottom leads 31.

Next, the entire package is inserted in a mold (not shown) and the mold housing the package is filled with a molding material such as epoxy resin for thereby forming the package body 37. At this time, it is important that the lower surface of each of the bottom leads 31 and the inner leads 32 should be exposed externally regardless of the mold to form the package body 37. The lower mold surface, i.e., the bottom surface for housing the package therein during the molding should have a protruded structure thereon, so that the space below the lower surface of each of the bent inner leads 32 cannot be filled with the molding material. Hence, openings 38 below and along the bent inner leads 32 in the package body 37 are obtained.

After the molding process, the completed package body 37 is extracted from the mold, and the nonconductive tape is removed from the respective lower surface of each of the bottom leads 31. The inner leads 32 and the lower surface of each of the leads 31, 32 is deflashed, thereby completing the bottom lead semiconductor package according to the present invention.

Figure 4:
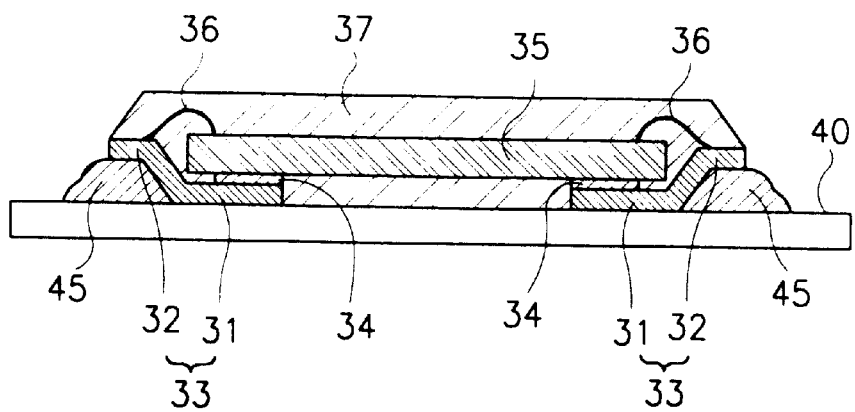
FIG. 4 is a schematic cross-sectional view of a bottom lead semiconductor package in accordance with the present invention mounted on a printed circuit board.

As shown in FIG. 4 illustrating a cross-sectional view of the bottom lead semiconductor package according to the present invention, the lower surface of each of the bottom leads 31 is placed on the printed circuit board 40. A solder 45 flows into the openings 38 through which the lower surface of each of the inner leads 32 is exposed, so that inner leads 32 come into contact with the printed circuit board 40 by solder 45, thereby completing the mounting of the package onto the printed circuit board 40.

As described above, by the fabrication method of the bottom lead semiconductor package according to the present invention, the inner leads upwardly bent or inclined from the corresponding bottom leads are exposed through the openings formed below the upwardly bent inner leads. A solder 45 flows into the openings to form an electrical connection between the inner leads and the printed circuit board. Such a solder joint has a widened contact area between the solder and the leads for filling the openings with the solder and further minimizes the height of the package structure when mounted on the printed circuit board.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A bottom lead semiconductor package, comprising:
   a plurality of leads that include bottom portions and inner portions that extend upward from corresponding ones of the bottom portions;
   a semiconductor chip attached to upper surfaces of the bottom portions by a nonconductive adhesive;
   a plurality of conductive wires electrically connecting the chip to corresponding ones of the inner portions; and
   a molding compound sealing the semiconductor package wherein a lower surface of each of the bottom portions is exposed outside the molding compound and wherein openings are formed in the molding compound to expose lower surfaces of each of the inner portions.

2. The package of claim 1, wherein each of the leads further include an inclined portion that extends between the bottom portion and the inner portion, and wherein the openings in the molding compound also expose lower surfaces of the inclined portions.

3. A fabrication method of a bottom lead semiconductor package, comprising:
   attaching a semiconductor chip by a nonconductive adhesive on upper surfaces of a plurality of leads, wherein each of the leads includes a bottom portion and an inner portion that extends from the bottom portion, wherein the bottom and inner portions are non-coplaner;
   connecting bond pads of the chip to the inner portions with conductive media;
   attaching a nonconductive tape on lower surfaces of the bottom portions and inner portions of the leads;
   packaging the semiconductor chip, the leads and the conductive media with a molding resin such that the lower surfaces of the bottom and inner portions of the leads are exposed outside the molding resin; and
   removing the nonconductive tape from the leads.

4. The method of claim 2, wherein the leads also include inclined portions extending between the bottom portions and the inner portions, and wherein the packaging step comprises leaving lower surfaces of the inclined portions exposed outside the molding resin.

5. The method of claim 2, wherein the packaging step comprises packaging the semiconductor chip, the leads and the conductive media such that the lower surfaces of the bottom portions of the leads are substantially flush with a lower surface of the molding resin, and such that openings are formed in the molding, wherein the openings expose lower surfaces of the inner portions of the leads that are recessed inside the molding resin.

6. A package comprising:
a chip having a plurality of bond pads;
a plurality of leads, each lead having first and second non-coplaner portions joined by an inclined portion, wherein the first, second and inclined portions have first and second surfaces;
an adhesive that attaches the chip to said plurality of leads;
a plurality of conductive media which couples corresponding bond pads to the second portions of corresponding leads;
a package body that molds said chip, said plurality of conductive media, said adhesive and said plurality of leads, wherein the package body covers the first surfaces of the first, second and inclined portions of the leads, wherein said second surface of said first portion of each of the leads is exposed from said package body, and wherein said package body includes a plurality of openings such that said second surface of said second portion and said inclined portion of each of the leads is exposed from said package body.

7. The package of claim 6, wherein said second surfaces of said first and second portions are substantially parallel.

8. The package of claim 6, wherein said plurality of conductive media comprises wires.

9. The package of claim 6, wherein said chip is attached at said first portion of said plurality of leads by said adhesive.

10. A device, comprising:
a chip package, including:
a chip having a plurality of bond pads,
a plurality of leads, wherein each of the leads includes a first portion and a second portion, wherein the first and second portions are non-coplaner, and wherein the leads have first and second surfaces,
a plurality of conductive media that couple bond pads on the chip to the second portions of corresponding leads, and
a package body that molds the chip, the leads and the plurality of conductive media such that the second surfaces of the first portions of the leads are exposed outside the package body, and wherein a plurality of openings are formed in the package body to expose second surfaces of the second portions of the leads that are recessed inside the package body;
a printed circuit board having a plurality of connection pads; and
a plurality of solder joints formed in the plurality of openings to couple the second portions of the leads to corresponding ones of the connection pads of the printed circuit board.

11. The device of claim 10, wherein said plurality of solder joints are also formed on the second surfaces of said first portions.

12. The device of claim 10, wherein said plurality of conductive media comprises wires.

13. The device of claim 10, wherein each of said plurality of leads further comprises an inclined portion coupling said first and second portions, said inclined portion having first and second surfaces.

14. The device of claim 13, wherein said package body molds the first surfaces of the inclined portions, and the second surfaces of the inclined portions are exposed from the package body through the openings.

15. The device of claim 10, wherein the chip is mounted on first surfaces of the leads by an adhesive.

16. The device of claim 15, wherein the chip is mounted on the first portions of the leads.

17. The device of claim 10, wherein the first and second portions of the leads are parallel, and wherein each lead includes an inclined portion between the first and second portion that spaces the second portion deeper inside the package body than the first portion.

18. A chip package, comprising:
a chip having a plurality of bond pads,
a plurality of leads, wherein each of the leads includes a first portion, a second portion, and an inclined portion joining the first and second portions, wherein the first and second portions are non-coplaner, and wherein the leads have first and second surfaces,
a plurality of conductive media that couple bond pads on the chip to the second portions of corresponding leads, and
a package body that molds the chip, the leads and the plurality of conductive media such that the second surfaces of the first portions of the leads are exposed outside the package body, and wherein a plurality of openings are formed in the package body to expose second surfaces of the inclined portions of the leads.

19. The chip package of claim 18, wherein the inclined portions of the leads are recessed inside a bottom surface of the package body.

* * * * *